United States Patent [19]

Buoli et al.

[11] Patent Number: 4,772,855
[45] Date of Patent: Sep. 20, 1988

[54] LINEARIZER FOR MICROWAVE POWER AMPLIFIERS

[75] Inventors: Carlo Buoli, Modena; Nicolangelo Palermo, Udine, both of Italy

[73] Assignee: Siemens Telecommunicazioni, S.p.A., Milan, Italy

[21] Appl. No.: 146,762

[22] Filed: Jan. 22, 1988

[30] Foreign Application Priority Data

Feb. 26, 1987 [IT] Italy ................................ 19497 A/87

[51] Int. Cl.$^4$ .............................................. H03G 9/20
[52] U.S. Cl. ........................................ 330/149; 332/17
[58] Field of Search ......................... 307/491; 328/162; 330/149, 307; 332/17, 18, 37 R, 41; 455/63

[56] References Cited

U.S. PATENT DOCUMENTS 4,268,802  5/1981  Fisher et al. ........................ 455/63 X
4,373,115  2/1983  Kahn ................................. 332/17 X
4,600,892  7/1986  Wagner et al. ................. 330/149 X Primary Examiner—Eugene R. LaRoche
Assistant Examiner—Steven J. Mottola
Attorney, Agent, or Firm—Jeffrey P. Morris

[57] ABSTRACT

A linearizer circuit is described having a main radio frequency or intermediate frequency network and secondary baseband frequency network. The main network includes a directional coupler, a delay line, a phase modulator and an amplitude modulator. The secondary network includes means for amplitude detecting and filtering an input signal and a pair of adjustable-gain amplifiers which receive the amplitude detected signal and on the basis of the gain adjustment act on the two modulators as to give them nonlinear response curves so as to compensate for the nonlinearity of the power amplifier placed downstream from the linearizer.

8 Claims, 2 Drawing Sheets

LINEARIZER FOR MICROWAVE POWER AMPLIFIERS

BACKGROUND OF THE INVENTION

1. Field of the Invention

The present invention relates to a linearizer for microwave power amplifiers.

2. Description of the Prior Art

Modulation systems presently in use in radio links, such as phase and amplitude modulation systems, impose very stringent linearity requirement for the radio frequency power amplifier of the transmitter on which the degradation of the modulated signal is dependent.

The nominal power of the signal supplied by the final amplifying devices must be considerably lower than the saturation power thereof so that the nonlinearity distortions due to compression of gain (AM/AM curve) at high powers and to the amplitude modulation-tophase modulation conversion (AM/PM), also at high powers, meet the specifications of the transmitter. This involves oversizing the amplifying devices which results in high cost of the power amplifying section.

It is known in the prior art to use a linearizing network in the transmitting section, for equal distortions produced, to permit the use of devices of lower saturation power with a resulting increase in performance, e.g. for applications in transmitters for repeaters on satellites or, for equal saturation power of the final devices, higher amplifier linearity, e.g. for applications in transmitters for earth stations.

The known linearization technique of "feed forward error control" provides that all the linearizers use an auxiliary microwave amplifier which amplifies an error signal obtained by the difference between the input signal and the distorted signal appropriately attenuated at the output of the main amplifier. The error signal is proportional to the distortions generated by the main amplifiers so that when added again with appropriate phase and amplitude at the output of the main amplifier it reduces the distortions with which the output signal is affected.

It is clear that the merit figure or degree of quality of this known linearization system depends almost entirely on the balancing of the final adder or coupler, which substracts the error signal from the output signal of the amplifier. An amplitude and phase balancing adjustment circuit of considerable complexity is therefore necessary for this coupler. In addition the foregoing is a true amplifier-linearizer unit in itself, not a mere addition to a known amplifier.

Another known linearization technique requires the use of predistortion networks, e.g. nonlinear networks, at radio frequency (RF) or intermediate frequency (IF), inserted upstream from the final microwave amplifier, which distort the input signal by means of networks configured with passive or active components such as diodes, GaAs FET, etc. all of which work in a nonlinear condition to produce AM/AM gain curves and AM/PM amplitude-to-phase conversion in a relationship such that the AM/AM curve and the AM/PM conversion of the "predistortion network-amplifier" unit ensures greater linearity to the transmitting section.

The RF predistortion networks, which use semiconductor devices operating at a high power level, require an inherently complex analysis and design phase since the behavior of their components must be described in nonlinear network terms. Consequently their development can be critical and their performance inflexible.

The predistortion networks accomplished in IF in addition to the difficulties they display in the analysis and design phase, due to the semiconductor devices used in a nonlinear state, also require new adjustment each time a different amplifier has to be installed on the transmitter.

In view of the aforementioned state of the art, the primary object of the present invention is to provide a linearizer capable of improving the performance of microwave power amplifiers without the aforementioned drawbacks of the prior art.

SUMMARY OF THE INVENTION

A linearizer of the predistortion type is provided upstream from a power amplifier wherein the linearizer comprises a main network including a phase modulator and an amplitude modulator arranged in cascade and a secondary baseband frequency network including means for amplitude sensing and filtering a part of the input signal to produce a sensed signal which is a function of the instantaneous input power and a pair of adjustable gain amplifiers fed with the sensed signal and acting on the modulators to provide nonlinear response curves to compensate independently for the amplitude nonlinearity and the phase nonlinearity of the power amplifier.

In the linearizer in accordance with the present invention, the entire main network can be easily analyzed, designed and tested since it includes only circuits which have linear performance with respect to the transmitted signal. The transmitted signal is not distorted by the circuit elements of the circuits, but only by the modulating action of signals applied by the adjustable gain amplifiers.

A further novel feature of the linearizer of the present invention, is the advantage thereof compared with known linearizers is that predistortions to be introduced to compensate for the AM/AM and AM/PM characteristics of the power amplifier to be linearized can be adjusted independently with the aid of a secondary network comprising elements easy to configure and operating at baseband frequency.

A further novel feature of the linearizer of the present invention is that the main network can be configured with few elements both in the case of a radio frequency (RF) input signal and in the case of an intermediate frequency (IF) input signal, thus assuring in both cases a high degree of reliability and low cost.

The linearizer of the present invention can be located at the input of the power amplifier, thus processing an RF signal and becoming an integral part thereof. In this manner, testing of the linearizer-amplifier unit is an operation in itself. Installation or replacement of the linearized amplifier does not involve adjustments of other sections of the transmitter, as in prior art IF predistortion networks where testing must necessarily be done with the entire system operating.

The linearizer of the present invention is described hereinafter with reference to a preferred embodiment and with reference to the accompanying drawings wherein:

DESCRIPTION OF THE PREFERRED EMBODIMENT

Figure 1:
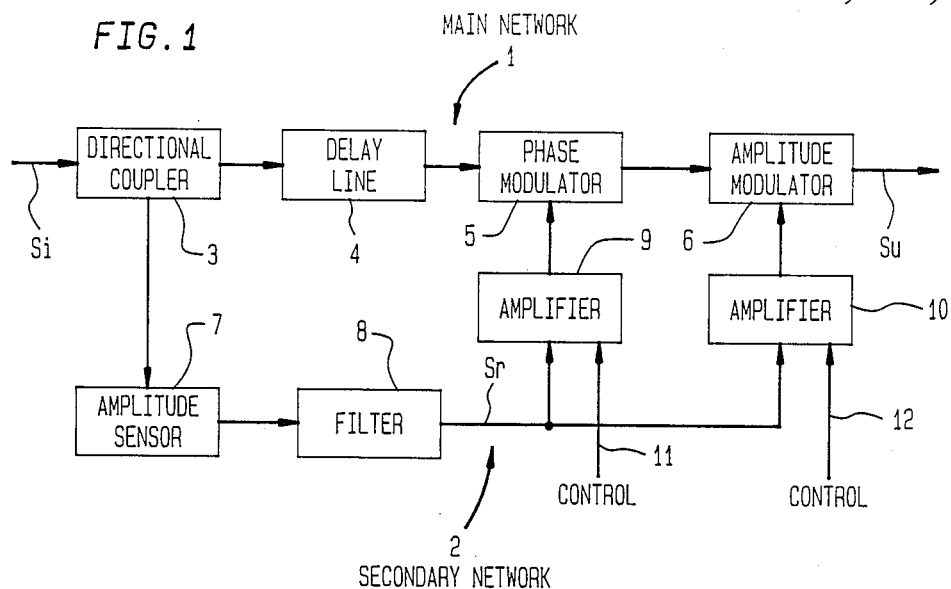
FIG. 1 shows a block diagram of a linearizer in accordance with the present invention.

The linearizer of FIG. 1 consists of a main radio frequency network 1 and a secondary network 2 which branches from the first network at a directional coupler 3 to which is applied a radio frequency input signal Si to be transmitted.

The main radio frequency network 1 comprises a delay line 4, a phase modulator 5 and an amplitude modulator 6. A modulated radio frequency signal Su representative of the input signal of the power amplifier to be transmitted is made available at the output.

The secondary network 2 comprises an amplitude detector 7 followed by a filter 8 at the output of which filter there is provided an amplitude detected signal Sr which is a function of the instantaneous power of the input signal Si.

The amplitude detected signal Sr is amplified by two amplifiers 9 and 10, the gain of each of which amplifiers 9 and 10 is adjustable by means of control signals 11 and 12 respectively.

The outputs of the amplifiers 9 and 10 are applied to the modulators 5 and 6 respectively, which modulators are each linear networks with respect to the radio frequency transmit signal so as to give the modulators 5 and 6 nonlinear response curves which vary with the gain control signals 11 and 12.

Figure 3:
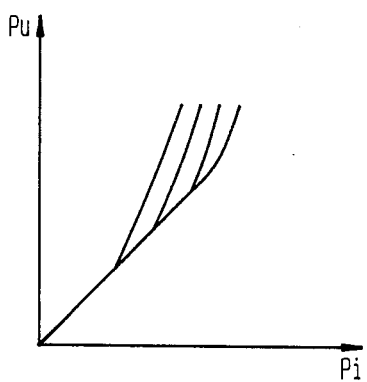
Figure 4:
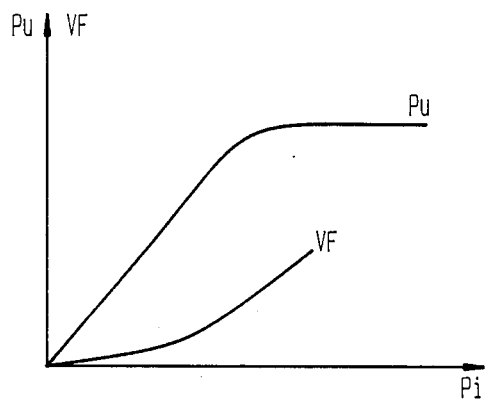
FIG. 4 shows the characteristic curves of a power amplifier.

Considering that a power amplifier typically has the response curves shown by FIG. 4 which represent the behavior of the output power Pu versus the input power Pi (AM/AM curve) with both powers expressed on a logarithmic scale (dBm) and the behavior of the phase variations VF (expressed in degrees) between the input and the output of the amplifier versus the input power Pi (AM/PM curve) respectively, the control signals 11 and 12 and hence the gains of the amplifiers 9 and 10 are selected in such a manner as to give the modulators 5 and 6 nonlinear response curves independently of each other to compensate for the phase and amplitude nonlinearity of the power amplifier. Typical response curves of the modulators 5 and 6 and hence of the linearizer of FIG. 1 are those illustrated in FIGS. 2 and 3 respectively which show the variation of these response curves with the control signals 11 and 12.

Figure 2:
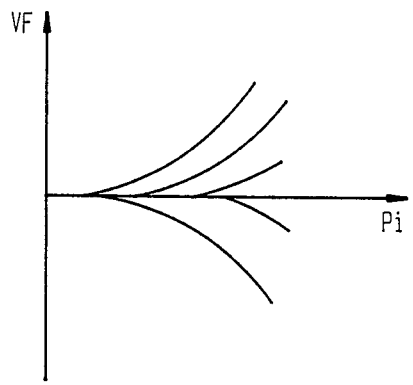
FIGS. 2 and 3 show typical response curves of the linearizer described with reference to FIG. 1.

FIG. 2 shows that it is possible to invert through the control signal 11 the sign of the gain of the amplifier 9. In this manner it is possible to obtain either advanced or delayed phase modulation. This permits linearization of power amplifiers with AM/PM either positive (advance) or negative (delay).

The two amplifiers 9 and 10 have a sufficiently wide band so as not to introduce amplitude linearity distortions in the band of the amplitude detected signal Sr and are easy to configure since they work on baseband.

The delay line 4 permits recovery in the main network 1 of the delay introduced by the elements making up the secondary network 2.

As the control signals 11 and 12 permit direct adjustment of the AM/AM and AM/PM curves they can be obtained from an automatic adjustment system which maximizes the linearity of the power amplifier, e.g. a system of adjustment based on temperature or on variations in long-term performance of the amplifier.

Figure 5:
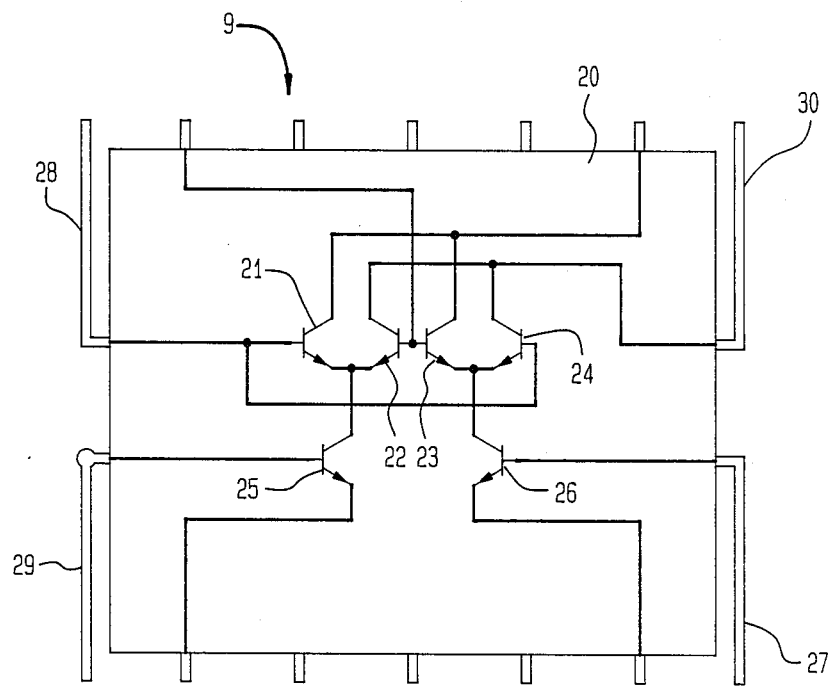
FIG. 5 shows an exemplary circuit of a possible adjustable-gain amplifier which may be used in the linearizer illustrated by FIG. 1.

FIG. 5 shows an example of a variable gain amplifier for use as the amplifier 9 or as the amplifier 10. The variable gain amplifier of FIG. 5 consists of an integrated circuit 20 comprising two pairs of opposing transistors 21, 22 and 23, 24 with common emitter and two transistors 25, 26 placed between the common emitter and ground. In operation, the pin 27 is kept grounded while the pin 28 receives the amplitude detected signal Sr and the pin 29 receives the control signal 11. The output signal is made available at the pin 30 and its signal depends on the voltage difference between the pins 29 and 27.

A further modification of the invention is to include in one or both of the above baseband frequency amplifiers nonlinear adjustable circuit elements to compensate with better approximation for the distortion characteristics of the power amplifier.

We claim:

1. A linearizer circuit for microwave power amplifiers comprising:
   a main network having a phase modulator and an amplitude modulator arranged in cascade;
   a secondary frequency network having means for amplitude detecting and filtering a part of an input signal to derive an amplitude detedted signal which is a function of instantaneous input power; and
   a pair of adjustable-gain amplifier means having said amplitude detected signal coupled thereto and acting on said phase and amplitude modulators to provide nonlinear response curves to said modulators such that said modulators each compensate independently for any amplitude nonlinearity and phase nonlinearity of said power amplifier.

2. A linearizer circuit in accordance with claim 1 wherein said amplifiers each include means for providing control signals for adjustment of the gain of each of said amplifiers.

3. A linearizer circuit in accordance with claim 1 wherein said adjustable gain amplifiers each include nonlinear circuit elements.

4. A linearizer circuit in accordance with claim 1 wherein said main network operates at radio frequency.

5. A linearizer circuit in accordance with claim 4 wherein said phase and amplitude modulators each include means for providing linear operation with respect to a radio frequency input signal.

6. A linearizer circuit in accordance with claim 1 wherein said main network operates at intermediate frequency.

7. A linearizer circuit in accordance with claim 6 wherein said phase and amplitude modulators each include means for providing linear operation with respect to an intermediate frequency signal.

8. A linearizer circuit in accordance with claim 6 wherein said main network includes at least one delay line located upstream from said phase and amplitude modulators.

* * * * *